(12) United States Patent
Nakamura et al.

(10) Patent No.: US 7,122,844 B2
(45) Date of Patent: *Oct. 17, 2006

(54) SUSCEPTOR FOR MOCVD REACTOR

(75) Inventors: Shuji Nakamura, Santa Barbara, CA (US); Steven DenBaars, Goleta, CA (US); Max Batres, Santa Barbara, CA (US); Michael Coulter, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 203 days.

This patent is subject to a terminal disclaimer.

(21) Appl. No.: 10/144,943

(22) Filed: May 13, 2002

(65) Prior Publication Data

US 2003/0209719 A1 Nov. 13, 2003

(51) Int. Cl.
*H01L 33/00* (2006.01)
*H01L 31/00* (2006.01)

(52) U.S. Cl. .................. 257/89; 257/90; 257/88; 257/291; 257/292; 257/440; 257/441; 438/689

(58) Field of Classification Search ............ 257/89, 257/10, 95, 627, 79, 200, 98, 103; 118/730, 118/725, 728, 719; 219/390, 405
See application file for complete search history.

(56) References Cited

U.S. PATENT DOCUMENTS

| | | | | |
|---|---|---|---|---|
| 5,356,476 A | | 10/1994 | Foster et al. ............. 118/725 |
| 5,370,739 A | * | 12/1994 | Foster et al. ............. 118/725 |
| 5,580,388 A | * | 12/1996 | Moore ..................... 118/728 |
| 5,683,518 A | * | 11/1997 | Moore et al. ............. 118/730 |
| 5,688,331 A | * | 11/1997 | Aruga et al. ............. 118/725 |
| 5,702,532 A | * | 12/1997 | Wen et al. ................ 118/730 |
| 5,788,777 A | | 8/1998 | Burk, Jr. ................. 118/730 |
| 5,817,406 A | * | 10/1998 | Cheung et al. ............. 428/210 |
| 5,858,102 A | * | 1/1999 | Tsai ......................... 118/719 |
| 6,001,183 A | | 12/1999 | Gurary et al. ............. 118/720 |
| 6,099,650 A | * | 8/2000 | Carbonaro et al. ........ 118/715 |
| 6,118,100 A | * | 9/2000 | Mailho et al. ............. 219/390 |
| 6,151,447 A | * | 11/2000 | Moore et al. ............. 392/418 |
| 6,184,498 B1 | * | 2/2001 | Kiyama .................... 219/390 |
| 6,217,662 B1 | * | 4/2001 | Kong et al. ................ 118/725 |
| 6,257,881 B1 | * | 7/2001 | Fiala et al. ................ 432/250 |

(Continued)

FOREIGN PATENT DOCUMENTS

DE 10132448 A 1/2003

(Continued)

OTHER PUBLICATIONS

Semiconductors and Semimetals, DenBaars and Kellar, vol. 50, Academic Press, Inc., 1997, p. 11-35.
Aria et al, "Highly Uniform Growth on a Low Pressure MOPVE Multiple Wafer System", Journal of Crystal Growth 170, pp. 88-91 (1997).

(Continued)

*Primary Examiner*—Nathan J. Flynn
*Assistant Examiner*—Fazli Erdem
(74) *Attorney, Agent, or Firm*—Koppel, Patrick & Heybl

(57) ABSTRACT

A susceptor for holding semiconductor wafers in an MOCVD reactor during growth of epitaxial layers on the wafers is disclosed. The susceptor comprises a base structure made of a material having low thermal conductivity at high temperature, and has one or more plate holes to house heat transfer plugs. The plugs are made of a material with high thermal conductivity at high temperatures to transfer heat to the semiconductor wafers. A metalorganic organic chemical vapor deposition reactor is also disclosed utilizing a susceptor according to the present invention.

25 Claims, 5 Drawing Sheets

(Exploded)

U.S. PATENT DOCUMENTS

| | | | |
|---|---|---|---|
| 6,310,327 B1 * | 10/2001 | Moore et al. | 219/405 |
| 6,325,858 B1 * | 12/2001 | Wengert et al. | 118/725 |
| 6,423,192 B1 * | 7/2002 | Wada et al. | 204/192.12 |
| 2001/0004880 A1 | 6/2001 | Cho et al. | |
| 2001/0009141 A1 * | 7/2001 | Kong et al. | 118/728 |
| 2001/0027970 A1 | 10/2001 | Li et al. | |
| 2002/0083899 A1 * | 7/2002 | Komeno et al. | 118/730 |
| 2002/0127508 A1 * | 9/2002 | Jin et al. | 432/93 |
| 2004/0175939 A1 * | 9/2004 | Nakamura et al. | 438/689 |

FOREIGN PATENT DOCUMENTS

| | | |
|---|---|---|
| EP | 0447031 A | 9/1991 |
| EP | 0519608 A | 12/1992 |
| FR | 1462335 A | 12/1966 |
| JP | 5-283349 * | 10/1993 |
| JP | 5283349 | 10/1993 |
| WO | WO0218672 A | 3/2002 |
| WO | WO03029516 A | 4/2003 |
| WO | WO03098667 A | 11/2003 |

OTHER PUBLICATIONS

Holstein, "Modeling of Chimney CVD Reactors", Journal of Crystal Growth 125, pp. 311-319 (1992).

Lee et al. "MOCVD in Inverted Stagnation Point Flow", Journal of Crystal Growth, pp. 120-127.

Parsons, J.D. "Inverted-Vertical OMVPE Reactor: Design and Characterization", Journal of Crystal Growth, North-Holland Publishing Co. Amsterdam, NL. vol. 116, No. 3/4, Feb. 1, 1992, pp. 387-396, XP000265338, ISSN: 0022-0248 p. 387-p. 389, figures 1-3.

Arai, T. et al. Highly Uniform Growth in a Low-Pressure MOVPE Multiple Wafer System: Journal of Crystal Growth, North-Holland Publishing Co. Amsterdam, NL., vol. 170, No. 1-4, 1997, p. 88-91, XP004087082, ISSN: 0022-0248 p. 88-89, figure 1.

Patent Abstracts of Japan, vol. 2000, No. 04, Aug. 31, 2000 and JP 2000 031064 A, Jan. 28, 2000.

* cited by examiner (Exploded)

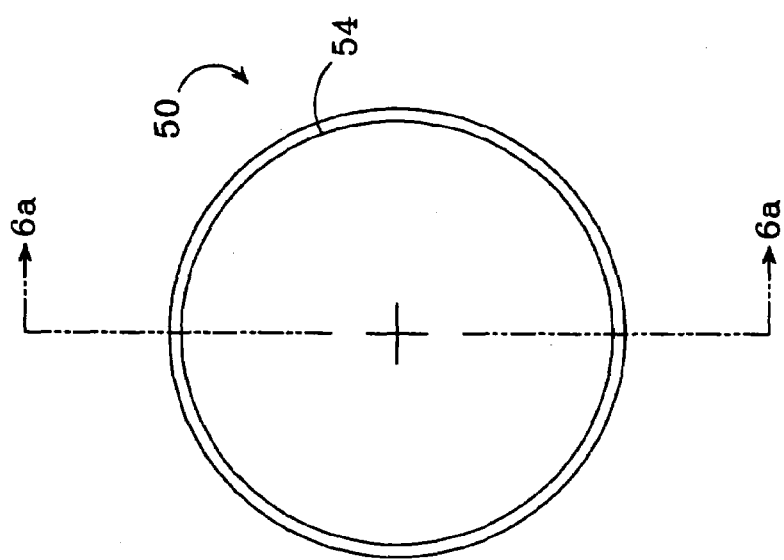
FIG.5
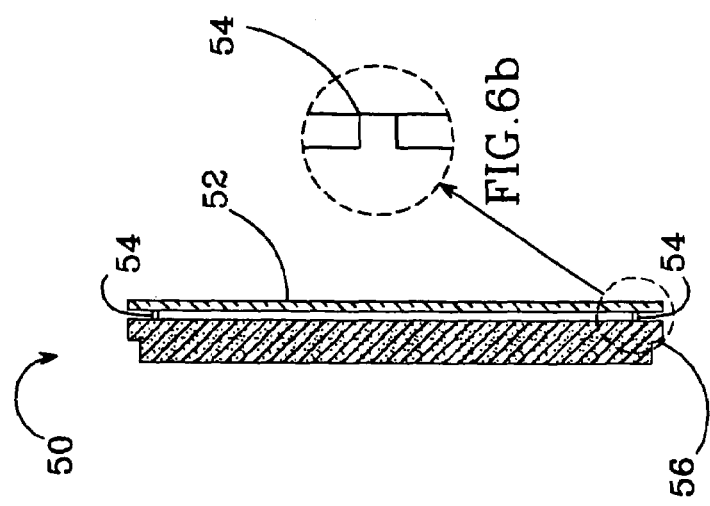
FIG.6a
FIG.6b

SUSCEPTOR FOR MOCVD REACTOR

BACKGROUND OF THE INVENTION

1. Field of the Invention

This invention relates to metalorganic chemical vapor deposition (MOCVD) reactors and more particularly to susceptors used in MOCVD reactors.

2. Description of the Related Art

Growth of gallium nitride (GaN) based semiconductor devices in MOCVD reactors is generally described in DenBaars and Keller, *Semiconductors and Semimetals*, Vol. 50, Academic Press Inc., 1997, p. 11–35. MOCVD is a non-equilibrium growth technique that relies on vapor transport of the precursors and subsequent reactions of group III alkyls and group V hydrides in a heated zone. Growth gasses and dopants are supplied to the reactor and are deposited as epitaxial layers on a substrate or wafer. One or more wafers usually rest on a structure of graphite called a susceptor that can be heated by a radio frequency (RF) coil, resistance heated, or radiantly heated by a strip lamp, or coil heater. During the growth process, the heated susceptor heats the wafers.

FIG. 1 shows a conventional susceptor 10 that is used in MOCVD reactors such as those provided by Thomas Swan Scientific Equipment Limited. It has a hollowed cylindrical shape and is mounted over the reactor's heating element at the bottom of the reactor, below the source gas inlet. It has a circular base plate 12 and cylindrical sleeve 13, with the circular plate 12 having a series of disk shaped depressions 14 equally spaced around the susceptor's longitudinal axis. Each of the depressions 14 can hold a semiconductor wafer during growth. When the susceptor 10 is heated by the heating element the semiconductor wafers are also heated. When source gases enter the MOCVD reactor, they combine and then deposit on the heated semiconductor wafers as epitaxial layers. The susceptor 10 can typically spin at speeds in the range of 0 to 2,000 rpm, which results in more uniform epitaxial layers on the wafers.

Conventional susceptors 10 are usually formed from a monolithic structure of graphite or coated graphite that absorbs heat from the heater element and conducts it to the wafers in contact with the susceptor 10. The entire susceptor 10 is heated uniformly to achieve consistent growth conditions across the surfaces of the wafers. During fabrication of the epitaxial layers, materials will not only deposit on the heated wafer, but will also deposit on the heated susceptor 10. This can cause deposition of significant amounts of GaN, InGaN, AlInGaN, and similar compounds on the susceptor surfaces. The result is a buildup of reaction deposits on the susceptor that can adversely impact subsequent fabrication steps. For instance, the deposits can act as impurities during subsequent growth of the epitaxial layers and can also result in poor interface transitions between different layers. For example, if a layer using an indium source gas was grown, indium can be deposited on the susceptor and though the next layer to be grown does not include indium, indium from the susceptor surfaces can be included in the transition between layers. These impurities can cause poor device performance and can prevent consistent reproduction of semiconductor devices on the wafer.

Another disadvantage of conventional susceptors is that the heating element heats the entire susceptor, not just the areas under or around the wafers. This requires large amounts of heat because the susceptor has a relatively large surface area in comparison to the wafers. Most of the energy is wasted by not heating the wafers. This taxes the heater, contributing to early heater failures. Also, more reactants are consumed due to the fact that the entire susceptor is at a temperature sufficient for chemical vapor deposition.

Another disadvantage of conventional susceptors is that they are difficult to manufacture. They must be machined from a large section of graphite and if any part of the susceptor is damaged the entire structure can be unusable. The fabrication of the depressions can be extremely difficult because they are off set from the structure's longitudinal axis. The depressions cannot be machined using a simple lathe, but must involve more complex processes. For the same reasons it is very difficult to modify the shape of the surface of the depressions to compensate for temperature non-uniformity.

SUMMARY OF THE INVENTION

The present invention discloses a susceptor for holding semiconductor wafers in a reactor during growth of epitaxial layers on the wafers. The susceptor comprises a base structure having a base plate and a sleeve that are both made of a material having low thermal conductivity at high temperature. The base plate has one or more plate holes. One or more heat transfer plugs are also included, with each plug housed within a respective one of the one or more plate holes. The heat transfer plugs are made of a material with high thermal conductivity at high temperatures to transfer heat to the semiconductor wafers.

The present invention also discloses a reactor for growing epitaxial layers on semiconductor wafers, including a reactor chamber housing a heating element and susceptor. The susceptor holds the semiconductor wafers and it is arranged over the heater element. The susceptor comprises a base structure having a base plate and a sleeve that are made of a material having low thermal conductivity at high temperature. The base plate has one or more plate holes with a heat transfer plug housed within a respective one of the plate holes. The wafers are arranged on the plugs, and the plugs are made of a material with high thermal conductivity at high temperatures. The plugs transfer heat from the heater element to the semiconductor wafers. A growth gas inlet is also included to provide gasses to grow epitaxial layers on the semiconductor wafers.

Reduced amounts of reactants are deposited on the susceptor embodiments disclosed herein, thereby reducing unwanted impurities during subsequent fabrication steps. The epitaxial layers can also be grown using less energy and consuming less source material, because most of the heat from the reactor's heating element passes through the heat transfer plugs instead of heating the entire susceptor. The susceptor can also be manufactured using less complex processes because it does not need to be machined from a solid piece of graphite. Also, the heat transfer plugs can be more easily machined so that their surface adjacent to the wafer has a convex or concave shape to compensate for any temperature non-uniformity.

These and other features and advantages of the invention will be apparent to those skilled in the art from the following detailed description, taken together with the accompanying drawings, in which:

BRIEF DESCRIPTION OF THE DRAWINGS

FIG. 5 is a plan view of a heat transfer plug used in the susceptor of FIG. 2;

FIG. 6a is a sectional view of the plug in FIG. 5, taken along section lines 6a—6a;

FIG. 6b. is a sectional magnified view of a plug ridge shown in FIG. 6a; and

DETAILED DESCRIPTION OF THE INVENTION

Figure 1:
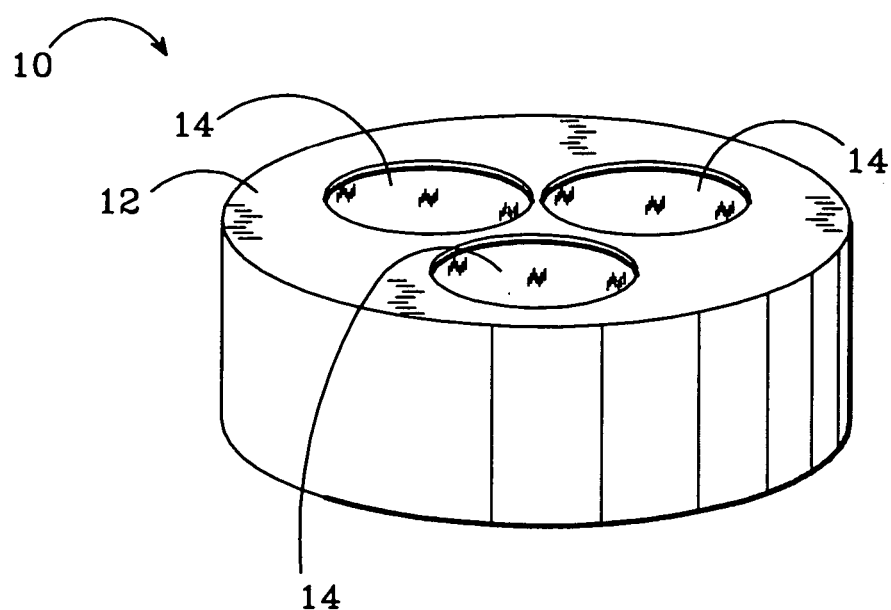
FIG. 1 is a perspective view of a prior art susceptor.
Figure 2:
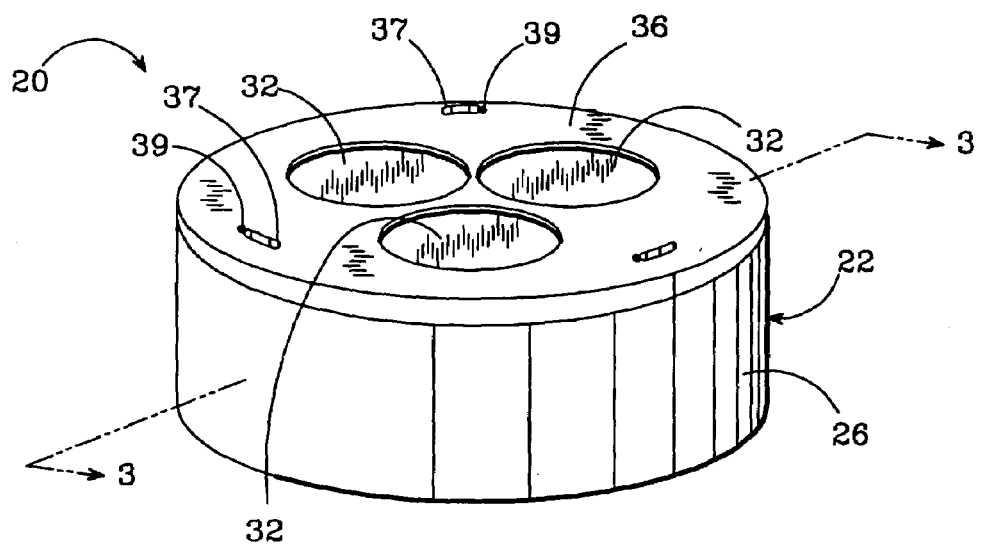
FIG. 2 is a perspective view of a susceptor according to the present invention.
Figure 3:
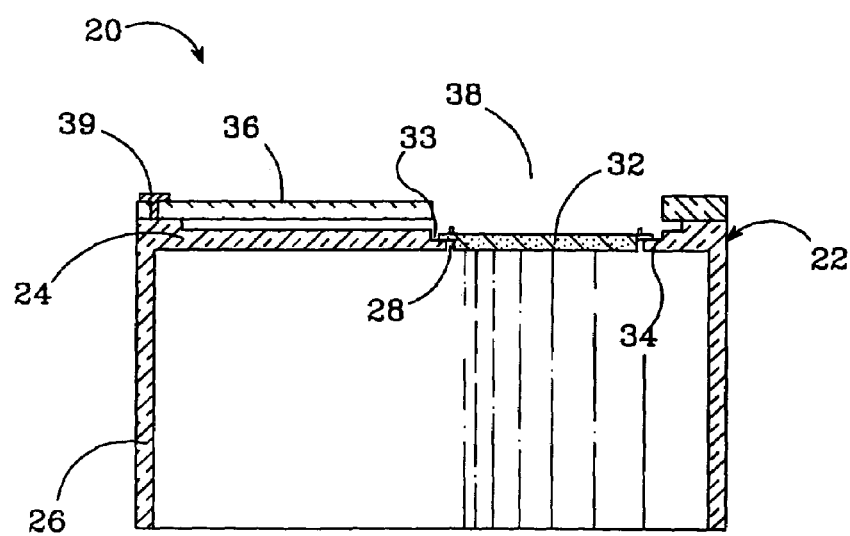
FIG. 3 is a sectional view of the susceptor in FIG. 2, taken along section lines 3—3.
Figure 4:
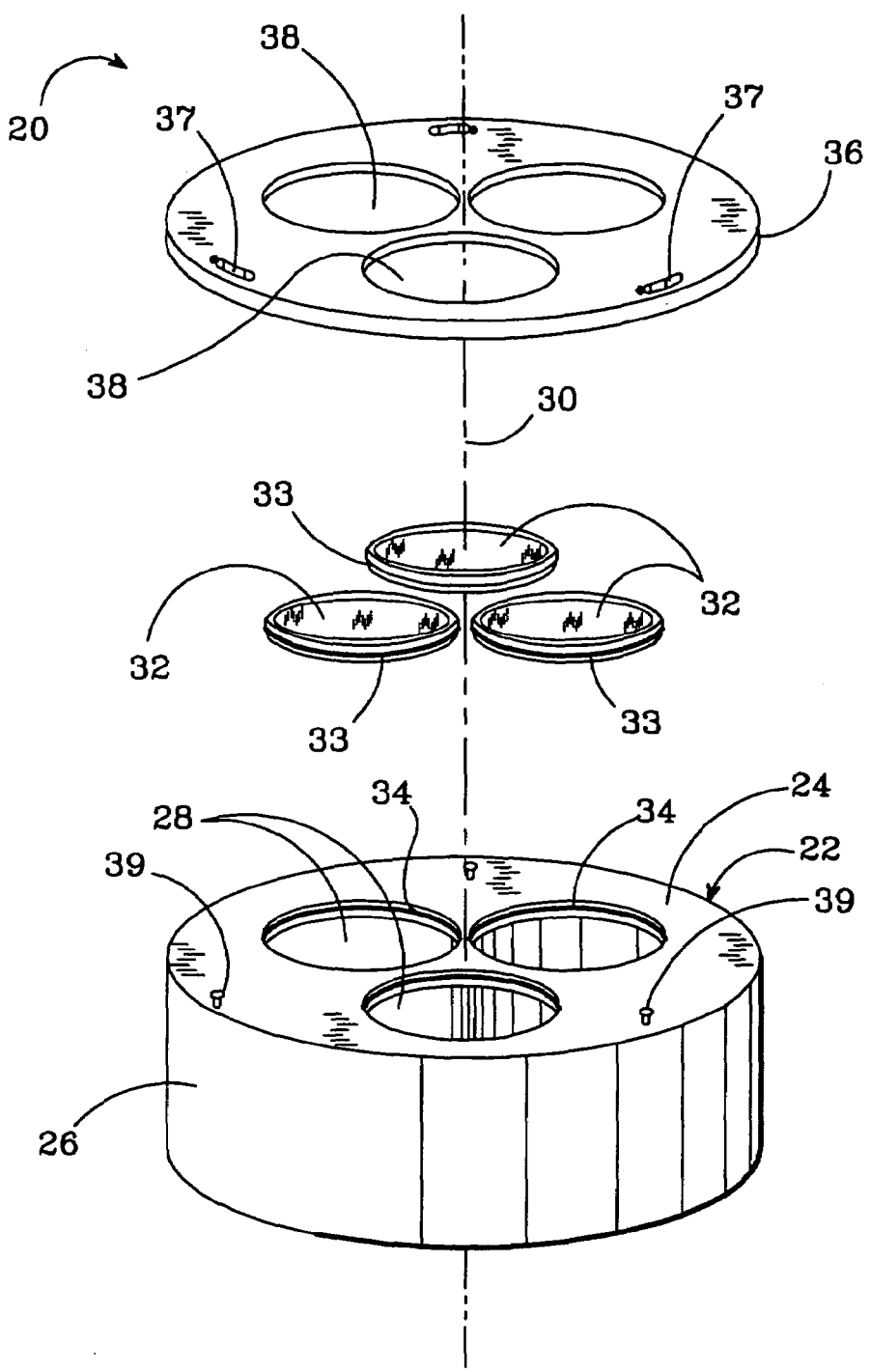
FIG. 4 is an exploded view of the susceptor in FIG. 2.

FIGS. 2 through 4 show a susceptor 20 according to the present invention, which can hold substrates or wafers for growth of epitaxial layers in an MOCVD reactor. The susceptor 20 can be mounted over the MOCVD reactor's heating element at the bottom of the reactor and can spin during the growth process.

The susceptor 20 includes a base structure 22 made of a base plate 24 and a cylindrical sleeve 26, which can be separate or manufactured as one structure. The base plate 24 has circular through holes 28 equally spaced around the susceptor's longitudinal axis 30. The number of through holes 28 can vary depending on the number of wafers that the susceptor 20 is designed to hold during growth.

The base structure 22 should be made of a rigid material that has a low thermal conductivity at high temperature so that it transmits less heat from the MOCVD reactor's heating element. It should also be made of a material that is reflective so that it reflects the heating element's radiative heat to further reduce the amount of heat it transmits. It should also have a low thermal expansion, so that its expansion matches that of the other susceptor components.

The base structure 22 can be made of many different materials such as boron nitride, fused quartz, aluminum nitride, or a ceramic, with the aluminum nitride and ceramics embodiments being coated with a material to reduce their reactance with the source gasses. A preferred base structure 22 is made of boron nitride or fused quartz covered by boron nitride. These materials have high thermal conductivity at low temperature, low thermal conductivity at high temperature, and boron nitride is white, which enhances the structure's reflectivity. The base structure 22 is manufactured using known methods.

The base structure 22 can have many different dimensions. A suitable height for the cylindrical sleeve is approximately 2 inches and a suitable diameter is approximately 6.2 inches for a susceptor holding three 2 inch wafers. The base plate 24 also has a suitable diameter of approximately 6.2 inches, with the plate holes 28 equally spaced around the center of the base plate 24. A suitable diameter for the plate holes 28 is approximately 2.3 inches. The base plate 24 and the sleeve 26 can have many different thicknesses, with a suitable thickness being approximately 0.2 inches.

The susceptor 20 also includes heat transfer plugs 32, each of which fit within a respective plate hole 28. Semiconductor wafers are placed in contact with the plugs 32 during growth of the epitaxial layers and heat from the heating element is efficiently conducted through the plugs 32, to the wafers. The plugs 32 are preferably made of a material having high thermal conductivity at high temperature and a dark color, both of which promote heat conduction. The preferred material for the plugs 32 is graphite or silicon carbide coated graphite. Each of the plugs 32 has an axial lip 33 around its outer surface, which rests on one of the axial ledges 34 on the inside surfaces of the through holes 28, such that a respective plug 32 rests within one of the holes 28.

A faceplate 36 can also be included that has holes 38 that align with the base structure's plate holes 28. The faceplate is arranged on the base structure's base plate 24 with the faceplate and base structure holes 38, 28 aligned. Only the plugs 32 are uncovered by the faceplate holes 38 and when a wafer is placed over the plug 32, only the wafer is uncovered by the holes 38.

The susceptor 20 works without the faceplate 36, but small amounts of reactants can deposit on the base structure 22 during epitaxial growth. The faceplate 36 provides a surface with a greater resistance to deposition of reaction species, with the surface also being easy to clean. It is preferably infrared transparent so that is does not absorb radiant heat. It should also be made of a material that does not react with MOCVD source gasses. It can be made of many different materials such as quartz, pure silicon carbide, sapphire, silicon, coated graphite, graphite or tungsten, with a preferred material being quartz. Deposits can be cleaned from quartz by acid etching.

The faceplate 36 should have approximately the same diameter as the base plate 22 and its holes 38 should have the same or slightly smaller diameter as the plate holes 28. The faceplate 36 can have many different thicknesses with a suitable thickness being approximately 0.16 inches.

The susceptor 20 is designed to spin over the reactor's heating element during growth, so the face plate 36 should be mounted to the base structure 22. Different mounting methods can be used including, but not limited to, pins on the structure 22 mated with mounting holes, axial slots or J-slots in the faceplate 36. Alternatively, rotatable hooks can be included on the structure to mate with slots in the faceplate 36. In one embodiment, the hooks can be turned away from the center of the base plate 24 and the faceplate 36 is then placed over the base plate 24, with the stem of the hooks aligned with a respective slot. The hooks are then rotated so they are directed toward the center of the base plate 24. In the embodiment shown in FIGS. 2 through 4, the faceplate has axial slots 37 that mate with pins 39 on the structure 22. Each pin 39 has a head that passes through the widest section of one of the slots 37. The faceplate is then turned until the stem of each pin 39 is housed within the narrow section of its respective slot 37.

A space can be included between the faceplate 36 and the base structure 22 to limit the conducted heat due to contact between the faceplate 36 and the base plate 24. This is best accomplished by including a raised section on the surface of the base plate 24, around its edge.

The susceptor 20 can be used in MOCVD reactors where the susceptor is arranged at the bottom of the reactor with the circular plate facing up. Growth gasses enter the reactor from the top or sides and are deposited on the uncovered wafers that are held over the plugs 40.

This susceptor 20 promotes the transfer of heat from the reactor's heating element through the plugs 32, which reduces the amount of deposits on the surface of the base structure 22. Reduction of such deposits reduces the presence of unwanted compounds during fabrication of subsequent layers. The fabrication process requires less growth gas because most of the gasses are deposited on the wafer. The resulting semiconductor device has sharper interfaces and lower levels of unwanted impurities. This increases the yield and reproducibility of the epitaxial growth process.

This design also reduces the amount of power required to maintain the wafers at any given temperature compared to conventional susceptors. The heat primarily passes through the plugs only, instead of the entire susceptor as in the prior art. This allows for the use of smaller and less expensive components in the heater control assembly, increases the life of the heater assembly, and allows the growth of the epitaxial layers using less energy and source gasses.

FIGS. 5 and 6 show one embodiment of a heat transfer plug 50 according to the present invention that is similar to the plugs 32 shown in FIGS. 3 and 4. Each plug 50 is substantially puck shaped and is designed to transfer heat from the reactor's heating element to a semiconductor wafer 52 (shown in FIGS. 6a and 6b) held in contact with the plug 50. The plug 50 can have a circular ridge 54 on its surface adjacent to the wafer 52, with only the ridge 54 contacting the wafer. This provides a small space between the wafer 52 and the plug 50 to promote even convective heating of the wafer. To further promote even heating of the wafer 52, the surface of the plug 50 adjacent to the wafer 52 can also have a convex, concave, or other shaped surface. The plug 50 should have a diameter that allows it to fit within one of the base plate through holes 28 and should have a size which allows for thermal expansion of the plug or base plate, with a suitable diameter being approximately 2.1 inches. Each plug 50 has a lip 56 (shown as reference number 33 in FIG. 3) around its edge so that the plug's top section of has a slightly larger diameter than its lower section. As described above in FIG. 4, each plug's lip 56 rests on a respective hole ledge (reference number 34 in FIG. 3).

The plug can have many different thicknesses, with a suitable thickness being approximately 0.33 inches. The ridge 54 can be many different sizes, with a suitable size being 0.002 inches high and 0.003 inches wide.

Prior to growth of the epitaxial layers, the wafers 52 and transfer plugs 50 are placed in the through holes 28 and the faceplate 36 is mounted to base structure 22 with the faceplate holes 38 aligned with the base structure's holes 28. The wafers 52 are uncovered by the faceplate 36 and when the plugs 50 are heated by the MOCVD's heating element, the wafers 52 are also heated. Growth gasses are fed into the reactor as the susceptor assembly 20 spins and epitaxial layers are grown on the wafers 52.

Figure 7:
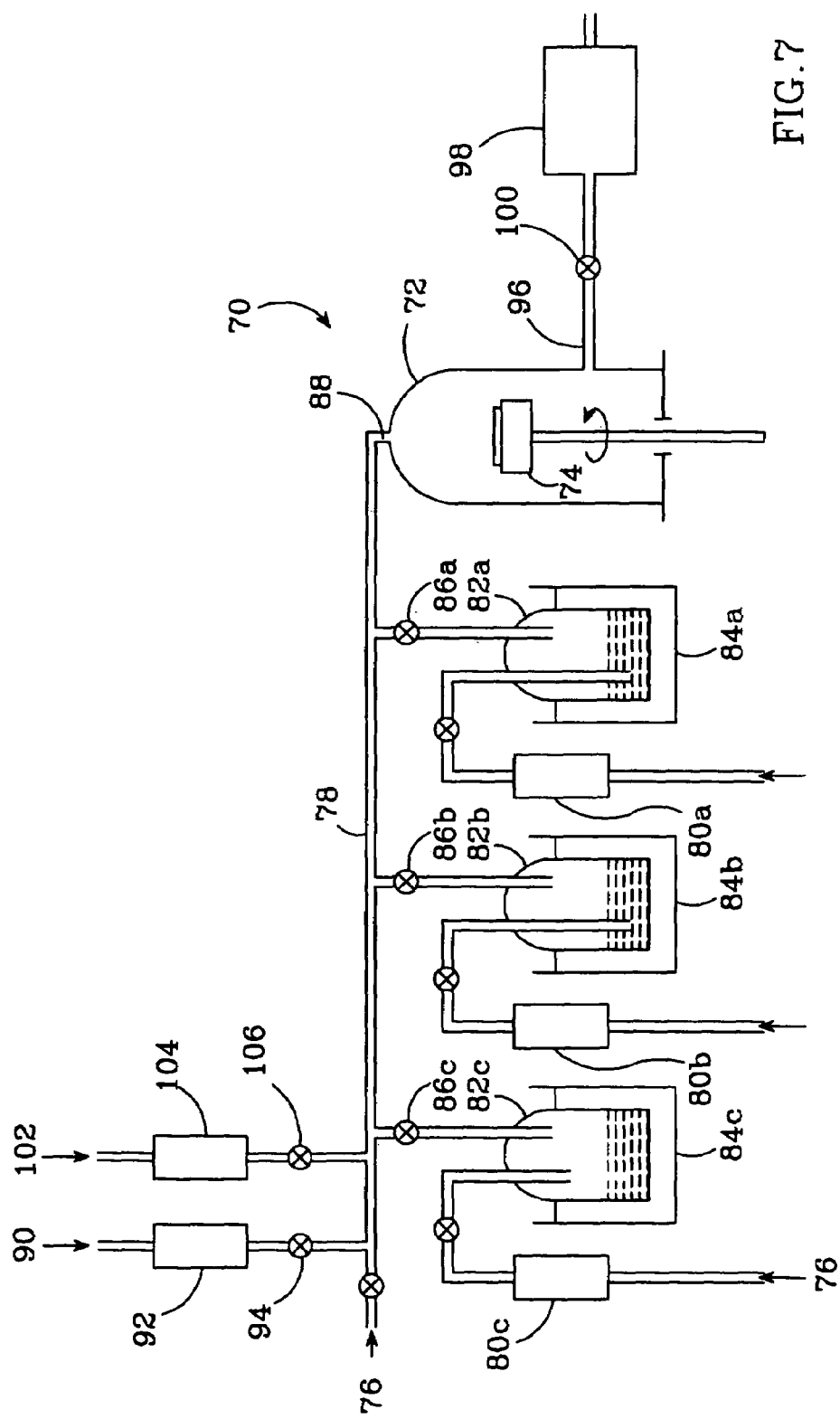
FIG. 7 is a simplified diagram of an MOCVD reactor using a susceptor according to the present invention.

FIG. 7 shows one embodiment of an MOCVD reactor 70 that can utilize a susceptor in accordance with the present invention for growing epitaxial layers on a wafer. The reactor 70 comprises a reaction chamber 72 having growth susceptor 74 that can spin. One or more wafers are mounted on the susceptor 74 for growth of epitaxial layers. During growth, the susceptor 74 is heated by a heater element (not shown) that is arranged within the susceptor 74, adjacent to the wafers. The heating element can be a variety of heating devices but is usually a radio frequency (RF) coil, resistance coil, or a strip heater.

A carrier gas 76 is supplied to a gas line 78, the carrier gas being an inert gas such as hydrogen or nitrogen. The carrier gas 76 is also supplied through mass flow controllers 80a, 80b, 80c to respective bubblers 82a, 82b, 82c. Bubbler 82a can have a growth compound, such as an alkylated compound having an organic group, e.g. trimethyl gallium (TMG), trimethyl aluminum (TMA) or timethyl indium (TMI). Bubbler 82b and 82c may also contain a similar methyl group compound to be able to grow an alloy of a Group III compound. The bubblers 82a, 82b, 82c are typically maintained at a predetermined temperature by constant temperature baths 84a, 84b, 84c to ensure a constant vapor pressure of the metal organic compound before it is carried to the reaction chamber 72 by the carrier gas 76.

The carrier gas 76, which passes through bubblers 82a, 82b, 82c, is mixed with the carrier gas 76 flowing within the gas line 78 by opening the desired combination of valves 86a, 86b, 86c. The mixed gas is then introduced into the reaction chamber 72 through a gas inlet port 88 formed at the upper end of the reaction chamber 72. A shower head inlet (not shown) can be included at the inlet port 88.

A nitrogen containing gas 90 such as ammonia, is supplied to the gas line 78 through a mass flow controller 92 and the flow of nitrogen containing gas is controlled by valve 94. If the carrier gas 76 is mixed with the nitrogen containing gas 90 and the TMG vapor within the gas line 78 and then introduced into the reaction chamber 72, the elements are present to grow gallium nitride on the wafer through thermal decomposition of the molecules present in the TMG and ammonia containing gas.

To dope alloys of gallium nitride on the wafer, one of the bubblers 82a, 82b, 82c not being used for the TMG is used for a dopant material, which is usually Magnesium (Mg) or Silicon (Si), but can be other material such as beryllium, calcium, zinc, or carbon. Bubbler 82b or 82c can be used for an alloy material such as boron aluminum, indium, phosphorous, arsenic or other materials. Once the dopant and alloy are selected and one of the valves 86a, 86b, 86c is opened to allow the dopant to flow into gas line 78 with the gallium and nitrogen containing gas 90, the growth of the doped layer of gallium nitride takes place on wafer.

The gas within the reaction chamber 72 can be purged through a gas purge line 96 connected to a pump 98 operable under hydraulic pressure. Further, a purge valve 100 allows gas pressure to build up or be bleed off from the reaction chamber 72.

The growth process is typically stopped by shutting off the gallium and dopant sources by closing valves 86a and 86b, and keeping the nitrogen containing gas and the carrier gas flowing. Alternatively, the reaction chamber 72 can be purged with a gas 102 that can be controlled through a mass flow controller 104 and valve 106. The purge is aided by opening valve 100 to allow the pump 98 to evacuate the reaction chamber 72 of excess growth gasses. Typically, the purge gas 102 is hydrogen, but can be other gasses. The wafer is then cooled by turning off power to the heater element.

Although the present invention has been described in considerable detail with reference to certain preferred configurations thereof, other versions are possible. The susceptor would also work without having a faceplate. As described above, susceptors according to the present invention can be used in many different reactors beyond MOCVD reactors and can be used in many different types of MOCVD reactors. The susceptors can be made of many different materials with many different dimensions. They can also be arranged differently, such as having the plugs 32 housed within the faceplate holes 38. Therefore, the spirit and scope of the appended claims should not be limited to the preferred versions in the specification.

We claim:

1. A susceptor for holding semiconductor wafers in a reactor for growing epitaxial layer, comprising:
   a base structure having a base plate and a sleeve, said base structure made of a material having low thermal conductivity at high temperature, said base plate having one or more plate holes; and
   one or more heat transfer plugs, each said plug housed within a respective one of said one or more plate holes, said one or more heat transfer plugs made of a material with high thermal conductivity at high temperatures to transfer heat to the semiconductor wafers.

2. The susceptor of claim 1, further comprising a faceplate mounted on said base plate, said faceplate having one or more faceplate through holes, each of said one or more faceplate through holes aligned with a respective one of said plate through holes.

3. A susceptor for holding semiconductor wafers in a reactor for growing epitaxial layer, comprising:
a base structure having a base plate and a sleeve, said base structure made of a material having low thermal conductivity at high temperature, said base plate having one or more plate holes;
one or more heat transfer plugs, each said plug housed within a respective one of said one or more plate holes, said one or more heat transfer plugs made of a material with high thermal conductivity at high temperatures to transfer heat to the semiconductor wafers; and
a faceplate mounted on said base plate, said faceplate having one or more faceplate through holes, each of said one or more faceplate through holes aligned with a respective one of said plate through holes, said faceplate being made of a material that is infrared transparent and cleanable by etching.

4. A susceptor for holding semiconductor wafers in a reactor for growing epitaxial layer, comprising:
a base structure having a base plate and a sleeve, said base structure made of a material having low thermal conductivity at high temperature, said base plate having one or more plate holes;
one or more heat transfer plugs, each said plug housed within a respective one of said one or more plate holes, said one or more heat transfer plugs made of a material with high thermal conductivity at high temperatures to transfer heat to the semiconductor wafers; and
a faceplate mounted on said base plate, said faceplate having one or more faceplate through holes, each of said one or more faceplate through holes aligned with a respective one of said plate through holes, said faceplate being made of a material from the group consisting of quartz, silicon carbide, sapphire, silicon, coated graphite, graphite, and tungsten.

5. The susceptor of claim 1, wherein said one or more heat transfer plugs are made of graphite or silicon carbide coated graphite.

6. The susceptor of claim 1, wherein each of said one or more heat transfer plugs include a circular ridge on the surface of each said plug that is adjacent to said wafer.

7. The susceptor of claim 1, wherein said base structure is made of a material from the group consisting of boron nitride, fused quartz, aluminum nitride or a ceramic.

8. The susceptor of claim 1, mounted in an reactor for the growth of epitaxial layers, said reactor having a heater element at the bottom of said reactor, said susceptor mounted over said heating element.

9. The susceptor of claim 8, wherein heat from said heating element is conducted to said wafers primarily through said heat transfer plugs.

10. The susceptor of claim 2, comprising a means for mounting said faceplate to said base structure to hold said faceplate when said susceptor spins.

11. A reactor for growing epitaxial layers on semiconductor wafers, comprising:
a reactor chamber housing a heating element and susceptor, said susceptor holding the semiconductor wafers and arranged over said heater element, said susceptor comprising:
a base structure having a base plate and a sleeve, said base structure made of a material having low thermal conductivity at high temperature, said base plate having one or more plate holes; and
one or more heat transfer plugs, each of said one or more plugs housed within a respective one of said one or more plate holes, said wafers on said plugs, said plugs made of a material with high thermal conductivity at high temperatures to transfer heat from said heater element to the semiconductor wafers,
a growth gas inlet for gasses to grow epitaxial layers on said semiconductor wafers.

12. The reactor of claim 11, wherein said heating element is at the bottom of said reactor chamber.

13. The reactor of claim 11, wherein said susceptor further comprises a faceplate mounted on said base plate, said faceplate having one or more faceplate through holes, each of said one or more faceplate through holes aligned with a respective one of said plate through holes.

14. A reactor for growing epitaxial layers on semiconductor wafers, comprising:
a reactor chamber housing a heating element and susceptor, said susceptor holding the semiconductor wafers and arranged over said heater element, said susceptor comprising:
a base structure having a base plate and a sleeve, said base structure made of a material having low thermal conductivity at high temperature, said base plate having one or more plate holes; and
one or more heat transfer plugs, each of said one or more plugs housed within a respective one of said one or more plate holes, said wafers on said plugs, said plugs made of a material with high thermal conductivity at high temperatures to transfer heat from said heater element to the semiconductor wafers;
a faceplate mounted on said base plate, said faceplate having one or more faceplate through holes, each of said one or more faceplate through holes aligned with a respective one of said plate through holes, said faceplate being made of a material that is infrared transparent and cleanable by etching;
a growth gas inlet for gasses to grow epitaxial layers on said semiconductor wafers.

15. A reactor for growing epitaxial layers on semiconductor wafers, comprising:
a reactor chamber housing a heating element and susceptor, said susceptor holding the semiconductor wafers and arranged over said heater element, said susceptor comprising:
a base structure having a base plate and a sleeve, said base structure made of a material having low thermal conductivity at high temperature, said base plate having one or more plate holes; and
one or more heat transfer plugs, each of said one or more plugs housed within a respective one of said one or more plate holes, said wafers on said plugs, said plugs made of a material with high thermal conductivity at high temperatures to transfer heat from said heater element to the semiconductor wafers;
a faceplate mounted on said base plate, said faceplate having one or more faceplate through holes, each of said one or more faceplate through holes aligned with a respective one of said plate through holes, said faceplate being made of a material from the group consisting of quartz, silicon carbide, sapphire, silicon, coated graphite, graphite, and tungsten, a growth gas inlet for gasses to grow epitaxial layers on said semiconductor wafers.

16. The reactor of claim 11, wherein said one or more heat transfer plugs are made of graphite or silicon carbide coated graphite.

17. The reactor of claim 11, wherein each of said one or more heat transfer plugs includes a circular ridge on the surface of each said plug that is adjacent to said wafer.

18. The reactor of claim 11, wherein said base structure is made of a material from the group consisting of boron nitride, fused quartz, aluminum nitride or a ceramic.

19. A susceptor for holding semiconductor wafers in a reactor for growing epitaxial layers, comprising:

a high thermal conductivity at high temperatures material adjacent said wafers to transfer heat to the semiconductor wafers; and a low thermal conductivity at high temperature material in all other areas; and a faceplate mounted on susceptor, said faceplate having one or more faceplate through holes, each of said one or more faceplate through holes aligned said high thermal conductivity at high temperature material.

20. The susceptor of claim 19, wherein said faceplate is made of a material that is infrared transparent and cleanable by etching.

21. The susceptor of claim 19, wherein said faceplate is made of a material from the group consisting of quartz, silicon carbide, sapphire, silicon, coated graphite, graphite, and tungsten.

22. The susceptor of claim 19, wherein said high thermal conductivity at high temperature material is made of graphite or silicon carbide coated graphite.

23. The susceptor of claim 19, wherein said low thermal conductivity at high temperature material is made of a material from the group consisting of boron nitride, fused quartz, aluminum nitride or a ceramic.

24. The susceptor of claim 19, wherein said low thermal conductivity material at high temperature comprises a base structure having a base plate and a cylindrical sleeve, said base plate having one or more plate holes.

25. The susceptor of claim 24, wherein said high thermal conductivity at high temperature material comprises one or more heat transfer plugs, each of said one or more plugs housed within a respective one of said one or more plate holes.

* * * * *